(12) United States Patent
Darr et al.

(10) Patent No.: US 6,894,891 B2
(45) Date of Patent: May 17, 2005

(54) SMART JUNCTION BOX FOR AUTOMOBILE

(75) Inventors: Christopher J. Darr, Livonia, MI (US); Brian Scigiel, Southgate, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 10/610,462

(22) Filed: Jun. 30, 2003

(65) Prior Publication Data

US 2004/0264113 A1 Dec. 30, 2004

(51) Int. Cl.⁷ ............................ H02B 1/00; H02B 1/26; H05K 5/00
(52) U.S. Cl. ...................... 361/601; 361/622; 361/641; 361/736; 361/752
(58) Field of Search ................................ 361/600–601, 361/641, 749, 752, 758, 796, 801, 804; 174/50.51, 50.52, 50.54

(56) References Cited

U.S. PATENT DOCUMENTS

| | | | | |
|---|---|---|---|---|
| 5,001,603 A | * | 3/1991 | Villaneuva et al. | 361/730 |
| 5,111,362 A | * | 5/1992 | Flamm et al. | 361/736 |
| 5,373,104 A | * | 12/1994 | Brauer | 174/52.1 |
| 5,466,161 A | | 11/1995 | Yumibe et al. | |
| 5,475,566 A | * | 12/1995 | Rada et al. | 361/736 |
| 5,715,135 A | | 2/1998 | Brussalis et al. | |
| 5,764,487 A | | 6/1998 | Natsume | |
| 5,995,380 A | | 11/1999 | Maue et al. | |
| 6,015,302 A | | 1/2000 | Butts et al. | |
| 6,111,760 A | * | 8/2000 | Nixon | 361/814 |
| 6,249,442 B1 | * | 6/2001 | Watanabe | 361/801 |
| 6,362,978 B1 | * | 3/2002 | Boe | 361/825 |
| 6,399,887 B1 | * | 6/2002 | Lin | 174/138 D |
| 6,442,027 B2 | * | 8/2002 | Sanada et al. | 361/704 |
| 6,496,377 B1 | | 12/2002 | Happ et al. | |
| 2002/0168882 A1 | | 11/2002 | Chiriku et al. | |

\* cited by examiner

*Primary Examiner*—Boris Chervinsky
(74) *Attorney, Agent, or Firm*—Bill C. Panagos

(57) ABSTRACT

A housing has a housing portion with a main portion and a retainer extending from the main portion. The retainer may cooperate with a first printed circuit board element to hold the first printed circuit board element in spaced relation to the main portion and hold a second printed circuit board element in spaced relation to the first printed circuit board element. The housing may have first and second housing portions that cooperate to form an enclosure for supporting a printer circuit board. A support element extends from the first housing portion. The retainer cooperates with the first printed circuit board element to pull the first printed circuit board element toward the support element, which supports the first printed circuit board element in spaced relation to the first housing portion. The retainer also holds a second printed circuit board element in spaced relation to the first printed circuit board element. The housing may be used in a control module.

13 Claims, 4 Drawing Sheets

SMART JUNCTION BOX FOR AUTOMOBILE

BACKGROUND OF INVENTION

This invention relates in general to automobile electrical power distribution systems and, more particularly, to control modules for automobile electrical power distribution systems. Most particularly, the invention relates to a junction box or housing for control modules for automobile electrical power distribution systems.

Electrical power distribution systems for automobiles have made rapid advancements. Such systems typically include a control module that provides central control of the electrical components of the automobile. A conventional control module includes a junction box, which is commonly referred to as a "smart junction box". The junction box includes a housing that contains a printed circuit board (PCB). The PCB supports surface mount (i.e., readily removable) components and soldered (i.e., permanently affixed) components. Such components typically do not require service and commonly include, for example, fuse terminals, relays and relay terminals, busbars, and connection terminals or blades (i.e., devices that interface with the automobile components). The blades function to connect the control module to the various components via corresponding sockets and wire harness. The housing is adapted to support serviceable components (i.e., components that are readily inserted and removed), such as fuses and relays. The control module functions to control various components, including, for example, power door locks, power seats, keyless entry, turn signals, and windshield wipers, to name a few.

A conventional PCB is typically in the form of a substrate supported copper traces. The PCB bends to form multiple overlapping PCB elements. In affect, the multiple overlapping PCB elements are joined together by rolled ends. The rolled ends are flexible portions of the copper traces, which extend from one PCB element to an overlapping PCB element. The overlapping PCB elements may further be joined by long pins, which may also provide an electrical connection between the traces of the overlapping PCB elements. The rolled ends provide edge support for a pair of opposing edges (e.g., in a longitudinal direction) of the overlapping PCB elements and the long pins may provide edge support for another pair of opposing edges (e.g., in a lateral direction) of the overlapping PCB elements Disposed between the overlapping PCB elements is an insulator plate. The insulator plate serves two functions: it prevents electrical contact between the overlapping PCB elements and holds the overlapping PCB elements in place relative to one another. The requirement of the insulator plate results in the use of material resources for the provision of the insulator plate, labor for the installation of the insulator plate, and assembly time.

An automobile electrical power distribution junction box is needed that conserves material resources, and reduces labor requirements and assembly time.

SUMMARY OF INVENTION

The present invention is directed towards a housing that meets the foregoing needs. The housing comprises a first housing portion having a main portion and a retainer extending from the main portion. The retainer is adapted to cooperate with a first printed circuit board element to hold the first printed circuit board element in spaced relation to the main portion and hold a second printed circuit board element in spaced relation to the first printed circuit board element. This electrically insulates the first and second printed circuit board elements from one another.

The present invention is also directed towards a junction box housing comprising first and second housing portions that are adapted to cooperate to form an enclosure for supporting a printer circuit board. At least one retainer and at least one support element each extend from the first housing portion. The retainer cooperates with a first printed circuit board element to pull the first printed circuit board element toward the support element, which supports the first printed circuit board element in spaced relation to the first housing portion. The retainer is also adapted to hold a second printed circuit board element in spaced relation to the first printed circuit board element, thus electrically insulating the first and second printed circuit board elements from one another.

The present invention is also directed towards a control module comprising a housing comprised of a first housing portion and a second housing portion that is adapted to be coupled to the first housing portion. At least one first printed circuit element is within the housing. At least one support element extends from the first housing portion. At least one retainer extends from the first housing portion and cooperates with the first printed circuit board element to pull the first printed circuit board element toward the support element, which holds the first printed circuit board element in spaced relation to the housing. This electrically insulates the first and second printed circuit board elements from one another.

Various objects and advantages of this invention will become apparent to those skilled in the art from the following detailed description of the preferred embodiment, when read in light of the accompanying drawings.

DETAILED DESCRIPTION

Figure 1:
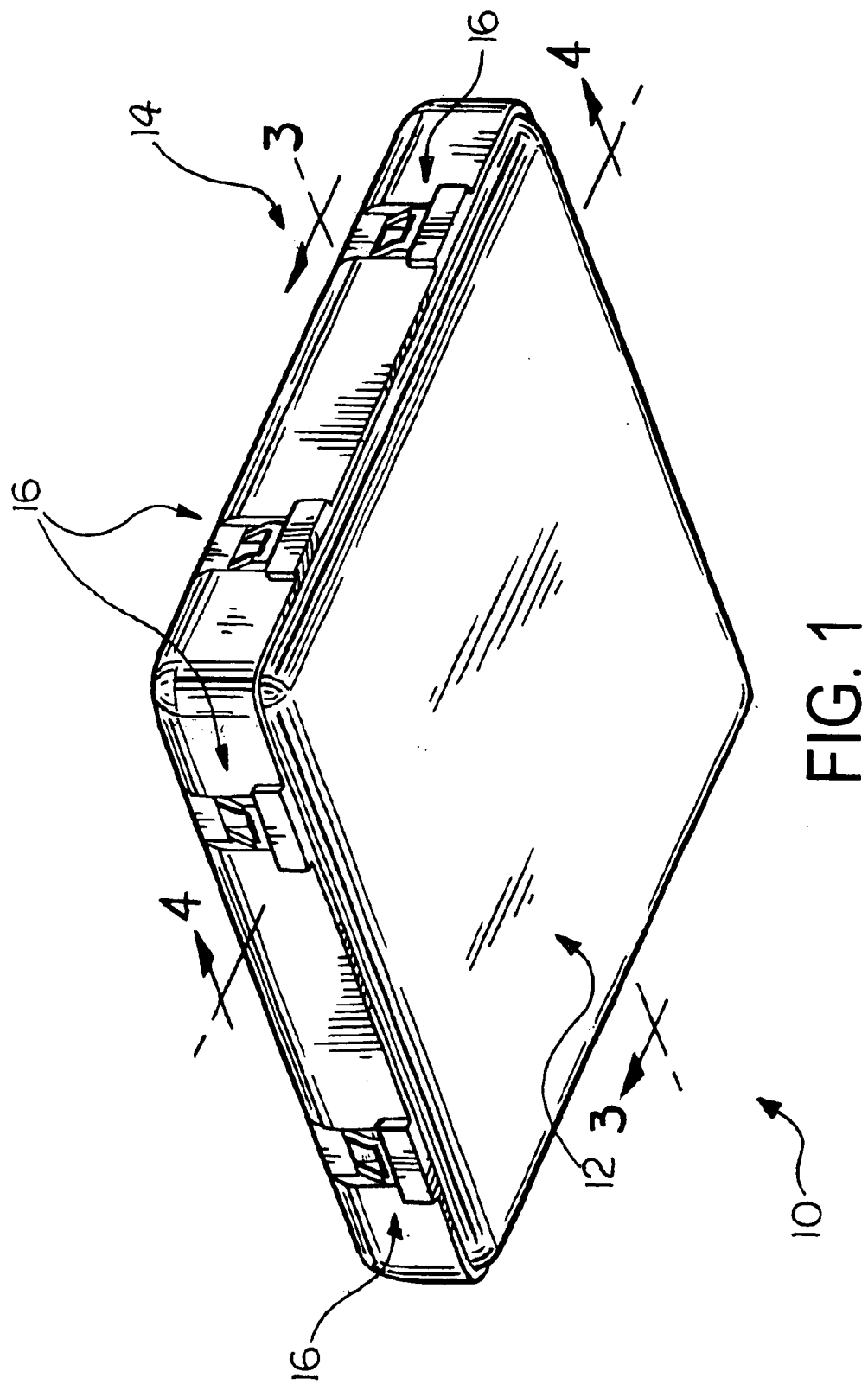
FIG. 1 is a perspective view of an automobile junction box according to a preferred embodiment of the invention.

Referring now to the drawings, there is illustrated in FIG. 1 a junction box or housing 10 for use in an automobile electrical power distribution system. The housing is adapted to hold or support electronic or electrical components, such as fuses, switches or relays, and a printed circuit board (PCB). The housing functions as a control module to provide a single location for central control of the electrical components. The electrical components may function to control various automobile components, including, for example, power door locks, power seats, turn signals, and windshield wipers, to name a few.

The housing 10 is comprised of a first housing portion 12 and a second housing portion 14. The first housing portion 12 and the second housing portion 14 are open box-like structures, which are adapted to be coupled together by one or more closures 16 to cooperatively form a closed box-like structure, or enclosure. In the illustrated embodiment of the invention, the first housing portion 12 and the second housing portion 14 are coupled together to form a box-like enclosure, which is substantially square when viewed in a viewed in a first direction (i.e., from the top when viewing FIG. 1) and shallow when viewed in a second direction transverse to the first direction (i.e., from the side when viewing FIG. 1). In the illustrated embodiment, a plurality of spaced closures 16 are spaced about girth of the housing 10. The number of closures 16 may depend on the size of the housing 10 and the type of closure 16 used.

Figure 2:
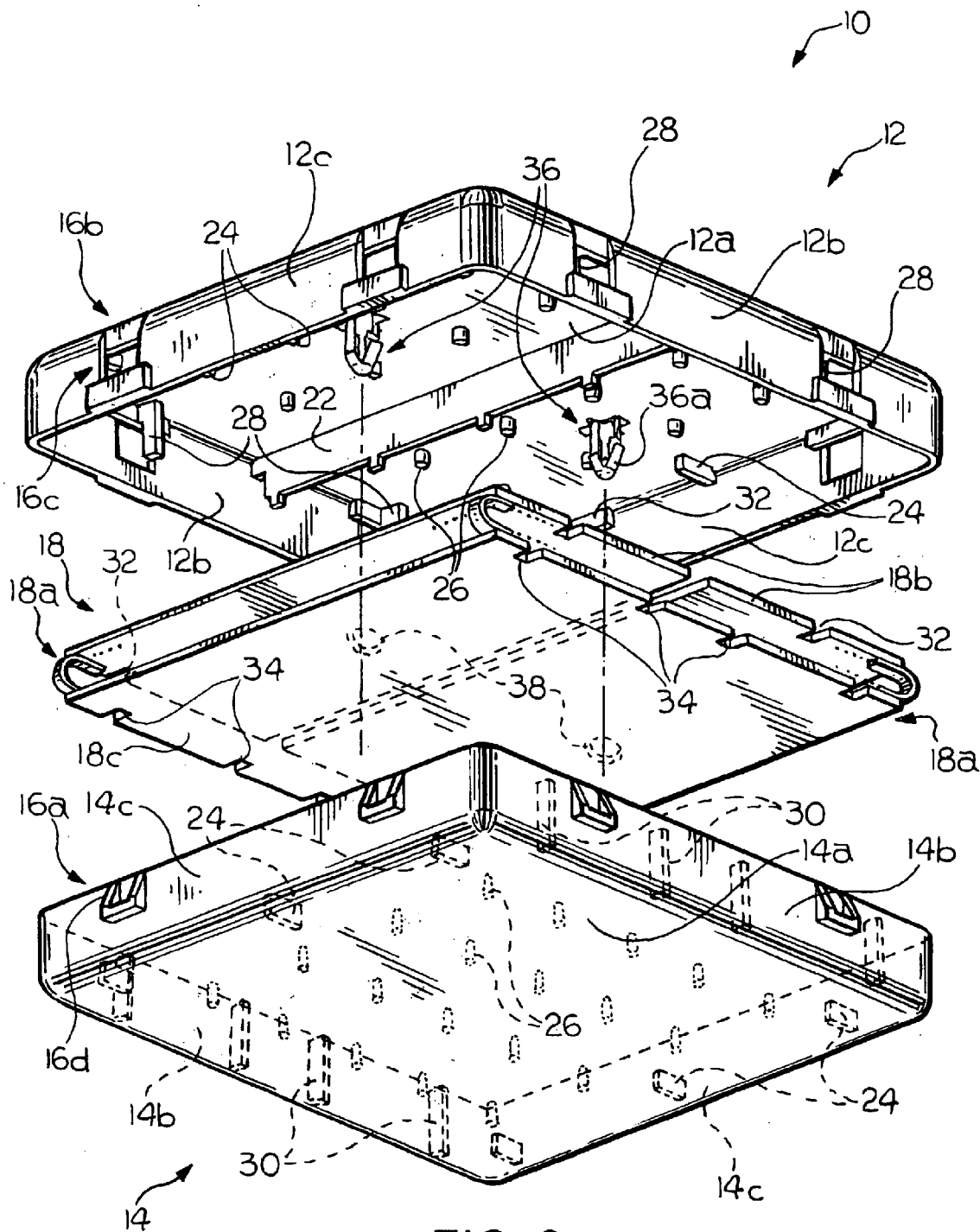
FIG. 2 is an exploded perspective view of the automobile junction box shown in FIG. 1.

Now, with reference to FIG. 2, the first housing portion 12, in accordance with the illustrated embodiment, comprises a base or main portion 12a, which is shown in the form of a plate-like element or a substantially flat or planar wall, and a plurality of side walls 12b, 12c, which extend from the main portion 12a and cooperatively form a peripheral side wall. In the illustrated embodiment of the invention, the side walls 12b, 12c are at right angles relative to the main portion 12a and one another for ease of assembly. It should be understood that the specific geometry of the housing 10 may depend, in large part, on the particular application of the housing 10. Consequently, the shape of the main portion 12a, the shape and number of the side walls 12b, 12c, and the angular disposition of these components relative to one another may vary from that shown and described above.

The second housing portion 14, similar to the first housing portion 16, comprises a base or main portion 14a, which is shown in the form of a plate-like element or a substantially flat or planar wall, and a plurality of side walls 14b, 14c, which extend from the main portion 14a and cooperatively form a peripheral side wall. In the illustrated embodiment of the invention, the side walls 14b, 14c are at right angles relative to the main portion 14a and one another for ease of assembly. The specific geometry of the housing 10 depends on the particular application of the housing 10. Consequently, the shape of the main portion 14a, the shape and number of the side walls 14b, 14c, and the angular disposition of these components relative to one another may vary from that shown and described above.

The closures 16 shown are well known in the art. Such closures 16 are commonly referred to as snaps, which include a first snap lock part 16a, which protrudes from the side walls 14a, 14b of one of the housing portions 14, and a mating or second snap lock part 16b, which is in the form of a relief or opening 16c in the side walls 12a, 12b of the other housing portion 12. The first snap lock part 16a has an angled engagement surface 16d that is adapted to engage the second snap lock part 16b, resulting in a camming engagement between the two parts 16a, 16b. This causes a deflection between the snap lock parts 16a, 16b. Upon complete engagement of the snap lock parts 16a, 16b, the protruding first snap lock part 16a enters or snaps into the opening 16c of the second snap lock part 16b to couple the first housing portion 12 and the second housing portion 14. To release the first housing portion 12 and the second housing portion 14, merely depress protruding first snap lock part 16a of each individual closure 16 to move the protruding first snap lock part 16a out of engagement with the opening 16c of the second snap lock part 16a, and more the first snap lock part 16a in a direction away from the second snap lock part 16a to separate the first housing portion 12 and the second housing portion 14.

The housing 10 is configured to support a rolled PCB, such as the PCB 18 shown, with rolled ends 18a adjoining a plurality of PCB elements. In the illustrated embodiment of the invention, the PCB is comprised of three PCB elements 18b, 18c. Two PCB elements, each indicated as 18b, cooperatively form a first PCB section or part and another single PCB element 18c forms a second PCB section or part. The two PCB elements 18b are folded over the single PCB element 18c via the rolled ends 18a and cooperatively form the PCB 18. In this folded posture, the two PCB elements 18b are axially spaced from the single PCB element 18c by a space that electrically insulates the two PCB elements 18b from the single PCB element 18c. It should be clearly understood and appreciated by those of ordinary skill in the art of the invention that electrical contact is achieved between the two PCB elements 18b and the single PCB element 18c by the rolled ends 18a and electrically conductive pins, which connect traces (not shown) on the PCB elements 18b, 18c. The traces interconnect fuse sockets, relays or relay sockets, and bus bars or bus sockets, none of which are shown but all are well known to those of ordinary skill in the art of the invention.

It is well known in the art that the PCB 18 functions to support components (not shown) that do not necessarily require service. Such components may be surface-mount components, which are readily inserted and removed, soldered components, which are more permanently affixed, and a number of blades or devices that interface with the automobile components. It should be clearly understood that the size and configuration of the housing 10 is dependent on the components supported in and by the housing 10.

As clearly shown in the drawings, the housing 10 is provided with an internal structure that is configured to support the PCB elements 18b, 18c in a fixed spaced relation to one another and the housing 10. The support structure includes with a PCB support beam 22 that provides axial support for the center of the single PCB element 18c to maintain a spatial relationship between the single PCB element 18c and the two PCB elements 18b. The PCB support beam 22 also provides lateral support between the two PCB elements 18b to maintain a spatial relationship between the two PCB elements 18b.

A plurality of PCB support elements is provided for axially supporting the PCB elements 18b, 18c. For example, a plurality of PCB edge supports 24 are also provided for axially supporting the edge of the PCB elements 18b, 18c and a plurality of support pads 26 are provided for axially supporting the remaining portions of the PCB elements 18b, 18c. These supports 24 and support pads 26 support the PCB elements 18b, 18b in spaced relation in an axial direction (i.e., a vertical direction when viewing FIG. 2) to corresponding housing portions 12, 14. Each housing portion 12, 14 also has a plurality of bi-passing edge supports 28, 30, which pass through notches or keyways 32, 34 in the edges of the PCB elements 18b, 18c and engage the edges of the other PCB elements 18b, 18c. These supports 28, 30 provide lateral support for one PCB element 18b, 18c and axial support for the other PCB element 18c, 18b. That is to say, the supports 28, 30 cooperate with the keyways 32, 34 in the PCB elements 18b 18c to support the PCB elements 18b, 18c in a lateral direction (i.e., a horizontal direction when viewing FIG. 2) and engage the other PCB element 18c, 18b to support the PCB element 18c, 18b in an axial direction. Although the supports 28, 30 are illustrated adjacent one opposing set of side walls 12b, 14b of each housing portion 12, 14, the supports 28, 30 may be provided adjacent the other side walls 12c, 14c, or adjacent all of the side walls 12b, 12c, 14b, 14c.

It should be noted, that in the illustrated embodiment, the bi-passing edge supports 28 on the first housing portion 12 are L-shaped elements that have an axially extending legs that is spaced away from a corresponding side wall 12b to provide clearance for the insertion of the second housing portion 14 into the first housing portion 12. Other housing configurations may result in a different shaped bi-passing edge support 28. For example, the second housing portion 14 could be provided with a notch or slot (not shown), which could provide clearance for the bi-passing edge support 28. Consequently, the bi-passing edge support 28 could be square or rectangular, and intersect the side wall 12b. Although not shown, it should be understood that the first housing portion 12 could be inserted into the second housing portion 14. In such case, the bi-passing edge supports 30 on the second housing portion 14 could be L-shaped elements that have an axially extending legs that is spaced away from a corresponding side wall 14b to provide clearance for the insertion of the first housing portion 12 into the second housing portion 14. Alternatively, the bi-passing edge support 30 could be square or rectangular, and intersect the side wall 14b and the first housing portion 12 could be provided with a notch or slot.

It also should be noted that one of the housing portions, the first housing portion 12 in the illustrated embodiment, has one of more PCB mounting provisions, such as the PCB clips or retainers 36 shown. The retainers 36 preferably extending axially from the main portion 12a and is preferably from integrally with the main portion 12a to form a structure or unitary construction. The PCB retainers 36 pass through a hole 38 in the two PCB elements 18b and are adapted to engage, touch, or otherwise contact the single PCB element 18c. Each retainer 36 is in the form of a post having an enlarged head 36a, which is axially spaced from the main portion 12a of the first housing portion 12. The head 36a of each retainer 36 is configured with flexible prongs that snap through a hole 38 in the two PCB elements 18b and the axially space between the head 36a and the main portion 12a is sufficient to pull the PCB elements 18b against corresponding edge supports 24 and support pads 26 and hold the two PCB elements 18b in a spaced relation to the single PCB element 18c. The head 36a of each retainer 36 also functions to hold the two PCB elements 18b in axial spaced relation to the single PCB element 18c. Consequently, the head 36a of the retainers 36 should be sized and configured accordingly. The spatial relationship between the PCB elements 18b, 18c electrically insulates the two PCB elements 18b from the single PCB element 18c.

Figure 3:
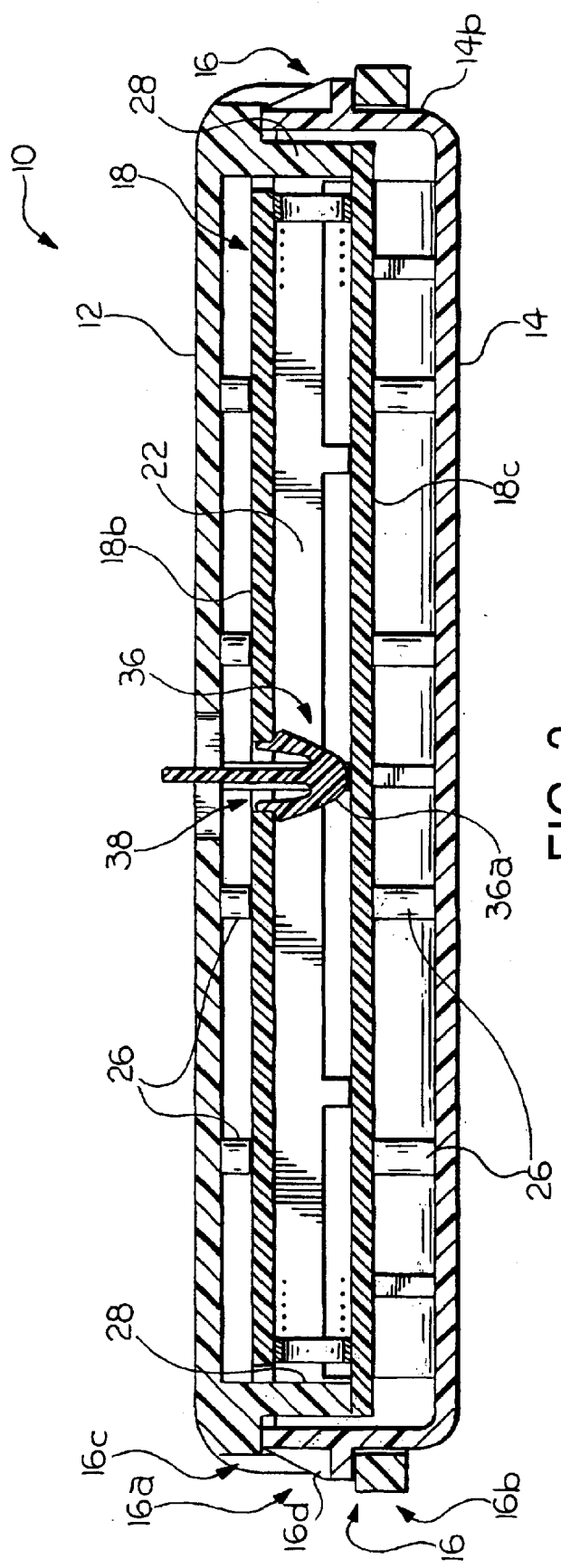
FIG. 3 is a cross-section view of the automobile junction box taken along the lines 3—3 in FIG. 1.
Figure 4:
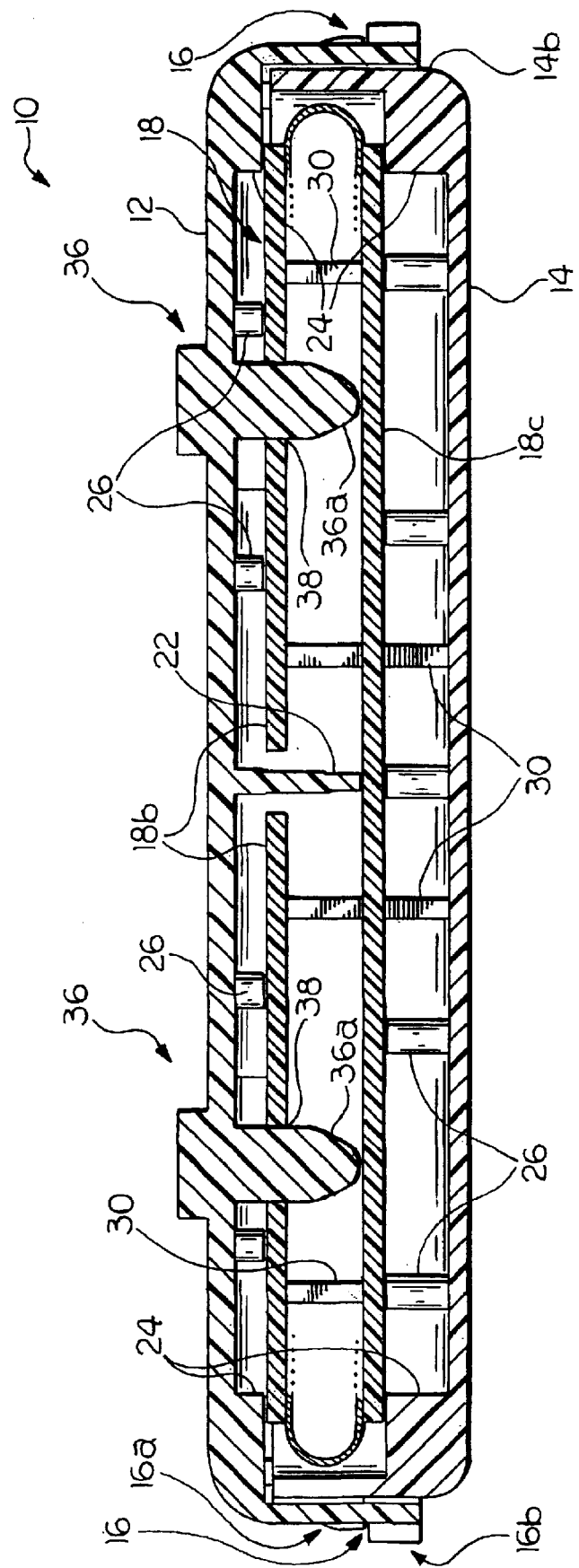
FIG. 4 is a cross-section view of the automobile junction box taken along the lines 4—4 in FIG. 1.

The holder 10 and the PCB 18 are shown assembled in cross-section in FIGS. 3 and 4. As shown in the drawings, the first housing portion 12 is coupled to the second housing portion 14 via the closure 16. As stated above, a first snap lock part 16a, which protrudes from the side walls 14b of one of the housing portions 14 mates with the second snap lock part 16b. As the housing portions 12, 14 are coupled together, the angled engagement surface 16d of the first snap lock part 16a engages the second snap lock part 16b, resulting in a camming engagement between the two parts 16a, 16b (i.e., the second snap lock part 16b deflects outward and the first snap lock part 16a deflects inward). The snap lock parts 16a, 16b completely engage when the protruding first snap lock part 16a snaps into the opening 16d of the second snap lock part 16b. This couples the first housing portion 12 and the second housing portion 14.

The PCB support beam 22 provides axial support for the center of the single PCB element 18c. It should be noted that the PCB support is provided with axially extending nubs that provide clearance between portions of the PCB support beam 22 and the single PCB element 18c. This clearance offers less restrictive air flow within the housing 10, which may aid in keeping the components within the housing 10 cool. The support beam 22 maintains a spatial relationship between the single PCB element 18c and the two PCB elements 18b and provides lateral support between the two PCB elements 18b.

The PCB edge supports 24 provide axial support for the edge of the PCB elements 18b, 18c and the support pads 26 provide axial support for the remaining portions of the PCB elements 18b, 18c. These supports 24 and support pads 26 support the PCB elements 18b, 18b in spaced relation in an axial direction (i.e., a vertical direction when viewing FIGS. 3 and 4) to corresponding housing portions 12, 14.

The bi-passing edge supports 28, 30 support the edges of opposing PCB elements 18b, 18c. That is to say, the bi-passing edge supports 28 on the first housing portion 12 pass through keyways 32 (shown in FIG. 2) in the edges of the two PCB elements 18b and engage the single PCB element 18c. Similarly, the bi-passing edge supports 30 (shown in FIG. 2) on the second housing portion 14 pass through keyways 34 (also shown in FIG. 2) in the edges of the single PCB element 18c and engage the two PCB elements 18b. The keyways 32 in the edges of the two PCB elements 18b are staggered (i.e., axially misaligned) relative to the keyways 34 in the edges of the single PCB element 18c so that the bi-passing edge supports 28, 30 can pass through corresponding keyways 32, 34 and engage corresponding PCB elements 18b, 18c without interference with one another. The edge supports 24 cooperate with the bi-passing edge supports 32, 34 to trap the PCB elements 18b, 18c therebetween. As clearly shown in the drawings, the L-shaped lateral supports 30 on the first housing portion 12 provide clearance for the insertion of the second housing portion 14 into the first housing portion 12.

As clearly illustrated in the drawings, the PCB retainers 36 pass through the holes 38 in the two PCB elements 18b and engage the single PCB element 18c. The head 36a of each retainer 36 is snapped through the hole 38 in the two PCB elements 18b to hold the two PCB elements 18b in a spaced relation to the first housing portion 12 and pull the PCB elements 18b against corresponding edge supports 24 and support pads 26. The head 36a of each retainer 36 holds the two PCB elements 18b in axial spaced relation to the single PCB element 18c.

It should be appreciated by one of ordinary skill in the art that the two PCB elements 18b are electrically insulated from the single PCB element 18c in an axial direction, without the need of an insulator plate, with is conventional in the art of the instant invention. Consequently, the invention reduces material consumption. The invention also requires less time to assembly due to the elimination of the extra component. This results in a substantial cost savings over the known housings.

The principle and mode of operation of this invention have been explained and illustrated in its preferred embodiment. However, it must be understood that this invention may be practiced otherwise than as specifically explained and illustrated without departing from its spirit or scope.

What is claimed is:

1. A housing for use in an automobile electrical power distribution system for supporting electronic components, the housing comprising:

a first housing portion having a main portion; and a retainer extending from the main portion, the retainer being adapted to cooperate with a first printed circuit board element to hold the first printed circuit board element in spaced relation to the main portion and hold a second printed circuit board element in spaced relation to the first printed circuit board element, wherein said retainer is integral with said first housing and includes a post having an enlarged head axially spaced from the main portion, said head including flexible prongs having a width greater than the width of a hole in the first printed circuit board, and wherein said head is configured to resiliently snap through the hole in the first printed circuit board element and expand outwardly to hold the first printed circuit board element in spaced relationship to the main portion.

2. The housing of claim 1, further comprising one or more printed circuit board edge supports extending from the first housing portion, the retainer being adapted to pull the first printed circuit board element against the one or more edge supports, the one or more edge supports holding the first printed circuit board element in spaced relation to the main portion.

3. The housing of claim 1, further comprising one or more support pads extending from the first housing portion, the retainer being adapted to pull the first printed circuit board element against the one or more support pads, the one or more support pads holding the first printed circuit board element in spaced relation to the main portion.

4. The housing of claim 1, further comprising one or more bi-passing edge supports, which pass through keyways in the first printed circuit board element and engage the second printer circuit board element to hold the second printed circuit board element in spaced relation to the first printed circuit board element.

5. A junction box housing for use in an automobile electrical power distribution system; the junction box comprising:

a first housing portion and a second housing portion adapted to cooperate with the first housing portion to form an enclosure for supporting a printer circuit board;

at least one retainer extending from the first housing portion; and at least one support element extending from the first housing portion, the retainer being configured to cooperate with a first printed circuit board element and pull the first printed circuit board element toward the support element, which supports the first printed circuit board element in spaced relation to the first housing portion, the retainer further being adapted to hold a second printed circuit board element in spaced relation to the first printed circuit board element, wherein said retainer is integral with said first housing and includes a post having an enlarged head axially spaced from the main portion, said head including flexible prongs having a width greater than the width of a hole in the first printed circuit board, and wherein said head is configured to resiliently snap through the hole in the first printed circuit board element and expand outwardly to hold the first printed circuit board element in spaced relationship to the main portion.

6. The junction box of claim 5, wherein the at least one support element includes one or more printed circuit board edge supports for supporting an edge of the first printed circuit board element in spaced relation to a main portion of the first housing portion.

7. The junction box of claim 5, wherein the at least one support element support pads for supporting the first printed circuit board element in spaced relation to a main portion of the first housing portion.

8. The junction box of claim 5, further comprising one or more bi-passing edge supports extending from the first housing portion, the one or more bi-passing edge supports are adapted to pass through keyways in the first printed circuit board element and engage a second printer circuit board element to hold the second printed circuit board element in spaced relation to the first printed circuit board element.

9. The junction box of claim 8, further comprising one or more bi-passing edge supports extending from the second housing portion and axially offset relative to the one or more bi-passing edge supports extending from the first housing portion, the one or more bi-passing edge supports each extending from the second housing portion are adapted to pass through a keyway in the second printed circuit board element and engage the first circuit board element to hold the first printed circuit board element in spaced relation to the second printed circuit board element.

10. A control module for use in an automobile electrical power distribution system, the control module comprising:

a housing comprised of a first housing portion and a second housing portion that is adapted to be coupled to the first housing portion;

at least one first printed circuit element within the housing;

at least one support element extending from the first housing portion; and at least one retainer extending from the first housing portion and cooperating with the first printed circuit board element to pull the first printed circuit board element toward the support element, which holds the first printed circuit board element in spaced relation to the housing, wherein said retainer is integral with said first housing and includes a post having an enlarged head axially spaced from the main portion, said head including flexible prongs having a width greater than the width of a hole in the first printed circuit board, and wherein said head is configured to resiliently snap through the hole in the first printed circuit board element and expand outwardly to hold the first printed circuit board element in spaced relationship to the main portion.

11. A control module of claim 10, further comprising:

a second printed circuit board element within the housing;

at least one support element extending from the second housing portion, wherein the support elements are edge supports;

at least one bi-passing edge support extending from the first housing portion through a keyway in the first printed circuit board element and engaging the second printer circuit board element to hold the second printed circuit board element against the edge support extending from the first housing portion and away from the first printed circuit board element; and at least one bi-passing edge support extending from the second housing portion through a keyway in the second printed circuit board element and engaging the first printer circuit board element to hold the first printed circuit board element against the edge support extending from the second housing portion and away from the first printed circuit board element, and wherein the retainer has a head that passes through a hole in the first printed circuit board element and engages the second printed circuit board element to hold the second printed circuit board element in spaced relation to the first printed circuit board element.

12. The control module of claim 11, wherein the keyway in the first printed circuit board element does not axially align with the keyway in the second printed circuit board element, and the bi-passing edge support extending from the first housing portion does not axially align with the bi-passing edge support extending from the second housing portion.

13. The control module of claim 11, wherein the first printed circuit board element and the second printed circuit board element are joined together in overlapping orientation by at least one rolled end to form a rolled printed circuit board element.

* * * * *